United States Patent
Huang et al.

(10) Patent No.: US 7,853,919 B2
(45) Date of Patent: Dec. 14, 2010

(54) MODELING MASK CORNER ROUNDING EFFECTS USING MULTIPLE MASK LAYERS

(75) Inventors: Jensheng Huang, San Jose, CA (US);
Chun-chieh Kuo, Hsinchu (TW);
Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/708,348

(22) Filed: Feb. 18, 2010

(65) Prior Publication Data
US 2010/0146476 A1    Jun. 10, 2010

Related U.S. Application Data

(62) Division of application No. 11/863,624, filed on Sep. 28, 2007, now Pat. No. 7,707,539.

(51) Int. Cl.
*G06F 17/50* (2006.01)
(52) U.S. Cl. ............... 716/19; 716/20; 716/21; 430/5
(58) Field of Classification Search ........... 716/19–21; 430/5
See application file for complete search history.

(56) References Cited

U.S. PATENT DOCUMENTS

| | | | |
|---|---|---|---|
| 6,214,494 B1 * | 4/2001 | Bula et al. ............ | 430/5 |
| 6,280,887 B1 * | 8/2001 | Lu ...................... | 430/5 |
| 6,329,107 B1 * | 12/2001 | Lu ...................... | 430/5 |
| 7,003,758 B2 * | 2/2006 | Ye et al. ............... | 716/21 |
| 7,079,223 B2 * | 7/2006 | Rosenbluth et al. ..... | 355/67 |
| 7,266,800 B2 * | 9/2007 | Sezginer ............... | 716/21 |
| 7,283,165 B2 * | 10/2007 | Alderson et al. ...... | 348/246 |

(Continued)

FOREIGN PATENT DOCUMENTS

EP      09034101      2/1997

OTHER PUBLICATIONS

Chou, Shou-Yen et al., "Study of mask corner rounding effects on lithographic patterning for 90-nm technology node and beyond", Proceedings of the Spie—The International Society for Optical Engineering Spie—Int. Soc. Opt. Eng USA, vol. 5546, No. 1, Apr. 14, 2004, pp. 508-515, XP002493559, ISSN:0277-786X.

(Continued)

*Primary Examiner*—Naum B Levin
(74) *Attorney, Agent, or Firm*—Park, Vaughan, Fleming & Dowler LLP; Laxman Sahasrabuddhe

(57) ABSTRACT

An embodiment provides systems and techniques for determining an improved process model which models mask corner rounding (MCR) effects. During operation, the system may receive a mask layout and process data which was generated by applying a photolithography process to the mask layout. The system may also receive an uncalibrated process model which may contain a set of MCR components. Next, the system may identify a set of corners in the mask layout. The system may then determine a set of mask layers, wherein at least some of the mask layers correspond to the MCR components. Next, the system may determine an improved process model by calibrating the uncalibrated process model using the set of mask layers, and the process data.

21 Claims, 7 Drawing Sheets

U.S. PATENT DOCUMENTS

| | | | | |
|---|---|---|---|---|
| 7,297,453 | B2 * | 11/2007 | Watson et al. | 430/30 |
| 7,302,111 | B2 * | 11/2007 | Olsson et al. | 382/266 |
| 7,444,615 | B2 * | 10/2008 | Percin et al. | 716/19 |
| 7,458,059 | B2 * | 11/2008 | Stirniman et al. | 716/21 |
| 7,600,212 | B2 * | 10/2009 | Zach et al. | 716/19 |

OTHER PUBLICATIONS

Keck, Martin et al., "High-accuracy simulation-based optical proximity correction", Proceedings of the Spie—The International Society for Optical Engineering Spie—Int. Soc. Opt. Eng USA, vol. 5256, No. 1, Sep. 9, 2003, pp. 926-936, XP002492560, ISSN: 0277-786X.

Mazen, Sadie et al., "3D Mask modeling with Oblique incidence and Mask Corner rounding effets for the 32-nm node", Proc. Spei Int. Soc. Eng; Proceedings of Spei—International Society for Optical Engineering; Photomask Technology 2007, vol. 6730, Sep. 18, 2007, XP002493561, pp. 8-10.

* cited by examiner

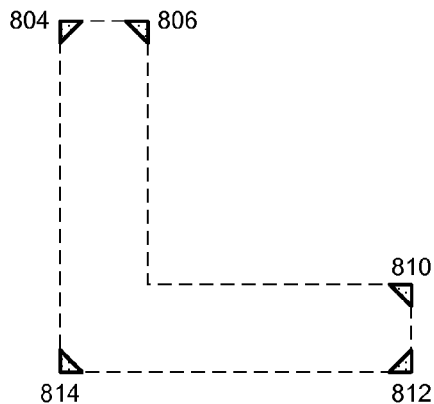
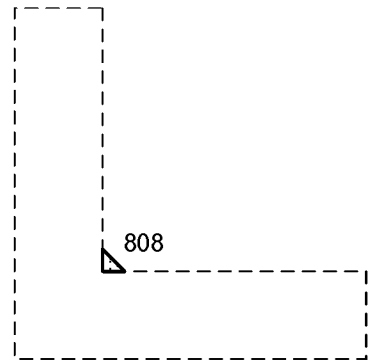
FIG. 8A
FIG. 8B
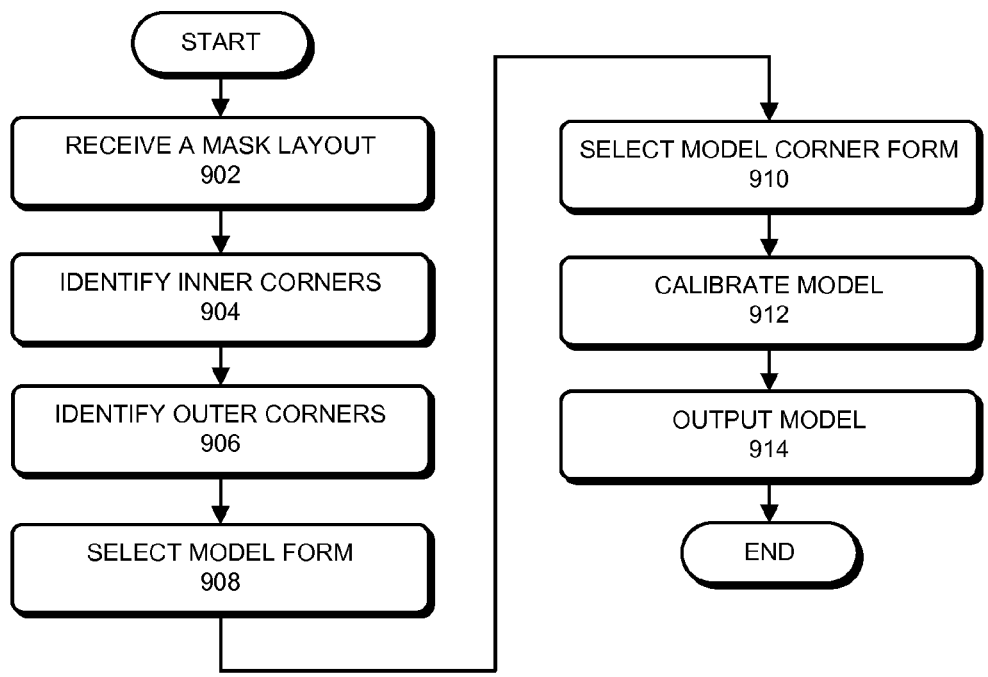
FIG. 9

MODELING MASK CORNER ROUNDING EFFECTS USING MULTIPLE MASK LAYERS

RELATED APPLICATION

This application is a divisional application of U.S. application Ser. No. 11/863,624, entitled "Facilitating Process Model Accuracy by Modeling Mask Corner Rounding Effects," by inventors Jensheng Huang, Chun-chieh Kuo, Lawrence S. Melvin III, filed on 28 Sep. 2007.

BACKGROUND

1. Field of the Invention

The present invention relates to semiconductor design and manufacturing. More specifically, the present invention relates to improving process model accuracy by modeling mask corner rounding (MCR) effects.

2. Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

Semiconductor manufacturing technologies typically include a number of processes which involve complex physical and chemical interactions. Since it is almost impossible to find exact formulae to predict the behavior of these complex interactions, researchers typically use process models which are fit to empirical data to predict the behavior of these processes. A process model can be used in a number of applications during the design of a semiconductor chip. For example, process models are commonly used for making corrections to layouts to compensate for undesirable effects of semiconductor manufacturing processes.

Inaccuracies in the process model can negatively affect the efficacy of downstream applications. For example, inaccuracies in the process model can reduce the efficacy of optical proximity correction (OPC). As semiconductor integration densities continue to increase at an exponential rate, the accuracy of process models is becoming increasingly important. Hence, it is desirable to improve process model accuracy.

SUMMARY

Embodiments of the present invention provide systems and techniques for determining an improved process model which models mask corner rounding effects. A process model is usually determined by fitting or calibrating kernel coefficients to process data. The process data is usually generated by applying the semiconductor manufacturing processes that are being modeled to a mask layout.

An embodiment of the present invention can modify a mask layout in proximity to a set of corners, and use the modified mask layout during process model calibration. Alternatively, an embodiment can determine a set of mask layers. One of the mask layers may be the mask layout itself or it may contain substantially all of the patterns in the mask layout. Other mask layers may contain patterns that relate to corners in the mask layout. The embodiment may calibrate the process model using the set of mask layers.

BRIEF DESCRIPTION OF THE FIGURES

FIG. 8A illustrates an outer corner mask layer in accordance with an embodiment of the present invention.

FIG. 8B illustrates an inner corner mask layer in accordance with an embodiment of the present invention.

FIG. 9 presents a flowchart that illustrates a process for determining an improved process model in accordance with an embodiment of the present invention.

DETAILED DESCRIPTION

Integrated Circuit (IC) Design Flow

Figure 1:
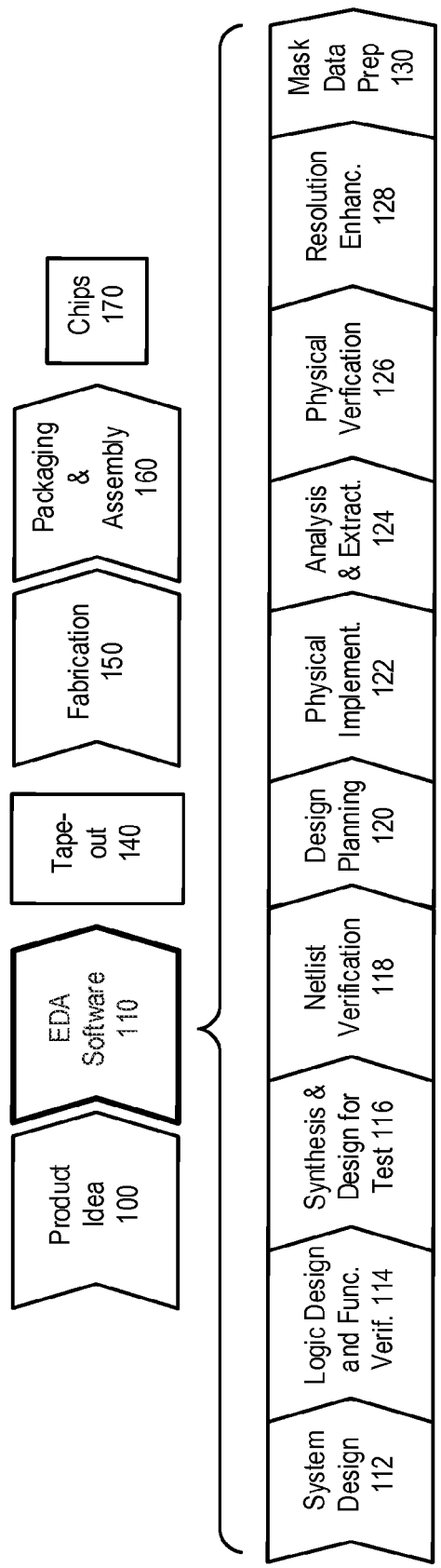
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process usually starts with a product idea (step 100) which is realized using an EDA software design process (step 110). Once the design is finalized, it is usually taped-out (event 140) and goes through the fabrication process (step 150) and packaging and assembly processes (step 160) to produce the finished chips (result 170).

The EDA software design process (step 110) comprises steps 112-130, which are described below for illustration purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda® products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare® products.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this stage, the circuit function is verified at a transistor level, this in turn permits what-if refinement. Exemplary EDA software products from Synopsys, Inc. that can be used at this step include AstroRail™, PrimeRail, PrimeTime®, and Star-RCXTT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during the resolution enhancement step 128.

Process Models

A process model models the behavior of one or more semiconductor manufacturing processes which typically involve complex physical and chemical interactions. A process model is usually determined by fitting or calibrating kernel coefficients to empirical data. The empirical data is usually generated by applying the semiconductor manufacturing processes that are being modeled to one or more test layouts. For example, a photolithography process can be used to print a test layout on a wafer. Next, the empirical data can be obtained by measuring the critical dimensions (CD) of the features on the wafer before and/or after the etch process. The process model can then be fit to the empirical data to determine a process model that models the photolithography process.

Once a process model is determined, it can be used in a number of applications during the design and manufacture of a semiconductor chip. For example, process models are typically used to support Optical Proximity Correction (OPC) and Resolution Enhancement Techniques (RET). These models can allow full-chip database manipulation in reasonable timeframes during the tapeout flow.

An uncalibrated process model typically includes components that are associated with parameters and/or coefficients. During calibration, the parameters and/or coefficients can be statistically fit to empirical data to obtain the final process model. A component in the process model is typically a mathematical expression that is designed to model a particular physical effect. For example, a process model may be represented as $$\sum_i (C_i \cdot K_i),$$

where $K_i$ is a component or kernel, and $C_i$ is a coefficient which is associated with $K_i$. The empirical data may include values of a desired property, e.g., the CD, at different locations in the layout. Once the process model is fit to the empirical data, it can then be used to predict the value of the desired property for other layouts.

It is usually impossible to calibrate coefficient values so that the predicted data exactly matches the empirical data. Even if an exact fit was available, it may not be desirable because the resulting process model may not interpolate and/or extrapolate properly. Typically, statistical fitting techniques are used to determine the parameters and/or coefficients so that the error between the empirical data and the predicted data is minimized. In one embodiment, the system can use a least-squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Photolithography Process Models

The optical model in a photolithography process model is usually based on the Hopkins model which models the behavior of partially coherent optical systems.

Figure 2:
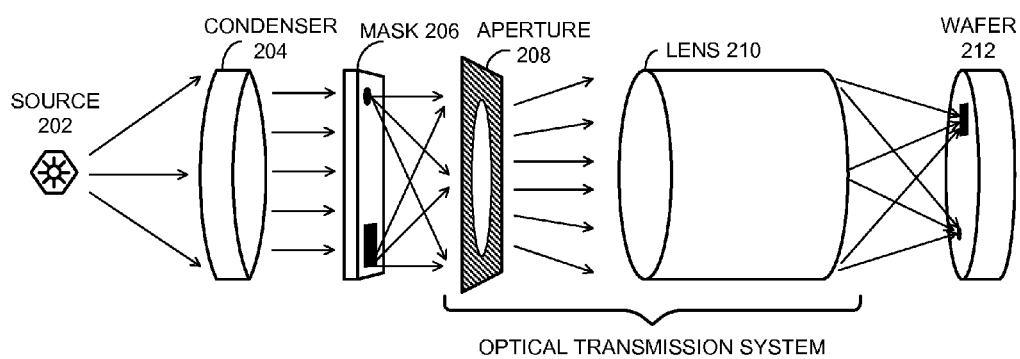
FIG. 2 illustrates a typical optical system in accordance with an embodiment of the present invention.

FIG. 2 illustrates a typical optical system in accordance with an embodiment of the present invention.

Radiation from source 202 can be collimated by a condenser 204.

The collimated light can then pass through mask 206, aperture 208, lens body 210, and form an image on a wafer 212.

Hopkins model can be described using the expression:

$$I(x,y) = \iiiint J(x',y';x'',y'') \otimes L(x,y;x',y') \otimes L^*(x,y;x'',y'') \, dx'dy'dx''dy'',$$

where, I(x, y) is the optical intensity at point (x, y) on the wafer, L(x, y; x', y') is a lumped model of the light source and the mask, L* is the complex conjugate of L, and J(x', y'; x'', y'') models the incoherence between two points of light on the mask. The lumped model (L) essentially treats the mask as an array of light sources. In particular, L(x, y; x', y') models point (x', y') on the mask as a point source, and J(x', y'; x'', y'') models the incoherence between the light emanating from points (x', y') and (x'', y'') on the mask. The lumped model (L) can be represented as a convolution between the mask and the source. For example, the lumped model can be represented using a mask model and a source model as follows:

$$L(x,y;x',y') = M(x',y') \otimes K(x,y;x',y'),$$

where M(x', y') models the mask and K(x, y; x', y') models the source.

The Hopkins model can be used to determine a 4-D (four dimensional) matrix called the Transmission Cross Coefficient (TCC) matrix which models the optical system. The TCC matrix can then be represented using a set of orthogonal 2-D (two dimensional) kernels. The set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics*, 2nd Edition, Dover Publications, 1989.

In one embodiment, the system uses a set of orthogonal functions called Zernike polynomials to represent the optical system. Zernike polynomials are made up of terms that are of the same form as the types of aberrations often observed in optical systems. For example, one Zernike polynomial may be associated with defocus, while another may be associated with tilt, etc. The optical system can be represented using the expression $$\sum_i (C_i \cdot Z_i),$$

where $Z_i$ is a Zernike polynomial and $C_i$ is an optical coefficient which is associated with $Z_i$. In one embodiment, the system may modify the coefficients in the optical model so that the optical model also models MCR effects. Alternatively, the system may add additional kernels or components to the optical model to capture the MCR effects.

Modeling Mask Corner Rounding Effects

Process model accuracy has become very important at current semiconductor integration densities, and is expected to become even more important in the future. Since conventional process models are not accurate enough at current integration densities, there is a strong need to improve process model accuracy.

Process models are usually based on a physical model or a black-box model, or a combination thereof. A physical model models the underlying physical process, whereas a black-box model typically uses generic modeling functions. The physical modeling approach is generally preferred because the black-box modeling approach can have a number of drawbacks. First, the generic modeling functions that are used in a black-box model usually require a large amount of empirical data to converge. Second, black-box models are not as accurate as physical models. Specifically, a black-box model is fit to empirical data which is obtained using a test layout. However, this does not guarantee that the model will work accurately with other layouts. Third, the empirical data is usually obtained at a particular process point (i.e., under certain process conditions). Hence, a black-box model that is fit to empirical data for a particular process point may not work accurately under different process conditions, e.g., under defocus or a different exposure energy. Hence, it is generally desirable to use physical models instead of black-box models.

However, determining an appropriate physical model is very challenging. In a typical physical modeling approach, first we have to identify a systematic process variation that is not negligible and which has not been modeled by the process model. Next, we have to identify the underlying physical processes which are causing the systematic variation. Finally, we have to determine a model that accurately models the underlying physical processes without sacrificing runtime performance.

At current integration densities, mask corner rounding (MCR) effects are causing non-negligible systematic process variations. Conventional process models do not accurately model these effects because they either completely ignore them, or they try to model the effects using black-box modeling techniques which do not accurately capture the underlying physical processes. In contrast to conventional techniques, one embodiment of the present invention accurately models MCR effects by determining an appropriate physical model.

Figure 3A:
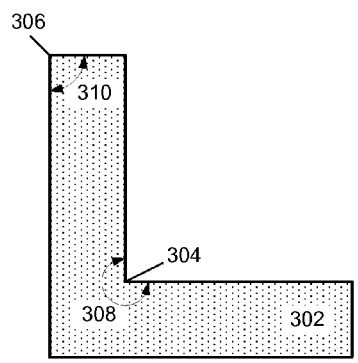
FIG. 3A illustrates a portion of a mask layout in accordance with an embodiment of the present invention.

FIG. 3A illustrates a portion of a mask layout in accordance with an embodiment of the present invention.

Polygon 302 is part of a mask layout and has an inner corner 304 and an outer corner 306. An inner corner is a corner whose interior angle is greater than 180°. For example, the interior angle 308 of inner corner 304 is greater than 180°. Conversely, an outer corner is a corner whose interior angle is less than 180°. For example, the interior angle 310 of outer corner 306 is less than 180°.

Figure 3B:
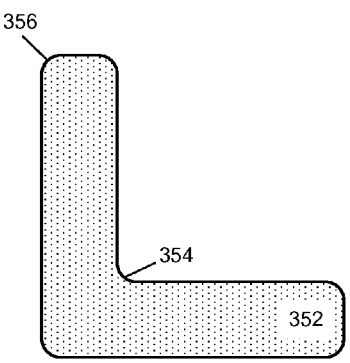
FIG. 3B illustrates a photolithography mask in accordance with an embodiment of the present invention.

FIG. 3B illustrates a photolithography mask in accordance with an embodiment of the present invention.

A photolithography mask is typically fabricated using electron beam lithography. Shapes in the mask layout are usually not transferred perfectly onto the photolithography mask. Specifically, sharp angles in the mask layout may become "rounded" during mask fabrication. This effect is known has "mask corner rounding." For example, when polygon 302 shown in FIG. 3A is fabricated, it may create polygon 352 shown in FIG. 3B. MCR effects may cause corners 304 and 306 in the mask layout shown in FIG. 3A to produce rounded corners 354 and 356, respectively, in the photolithography mask shown in FIG. 3B.

Conventional process models typically predict the shapes on the wafer using a mask layout which contains "perfect" polygons, e.g., polygon 302. However, since the actual polygons on the photolithography mask are not "perfect," e.g., polygon 352, the results produced by conventional models are inaccurate. Conventional approaches that use black-box models to model corner rounding effects may not be successful because black-box models may not accurately capture the underlying physical processes that affect different types of corners in different ways. For example, the MCR effect on inner corners and outer corners may be different, and this difference may not be properly captured by a black-box model. Furthermore, conventional approaches that model MCR effects using a black-box model can cause the process model to become inaccurate for other types of patterns, e.g., line-and-space patterns.

Modeling approaches used in the present invention do not suffer from the above-described drawbacks because they model the MCR effects based on the underlying physical processes. The following sections describe approaches for modeling MCR effects in accordance with embodiments of the present invention.

Single-Layer Approach

Figure 4:
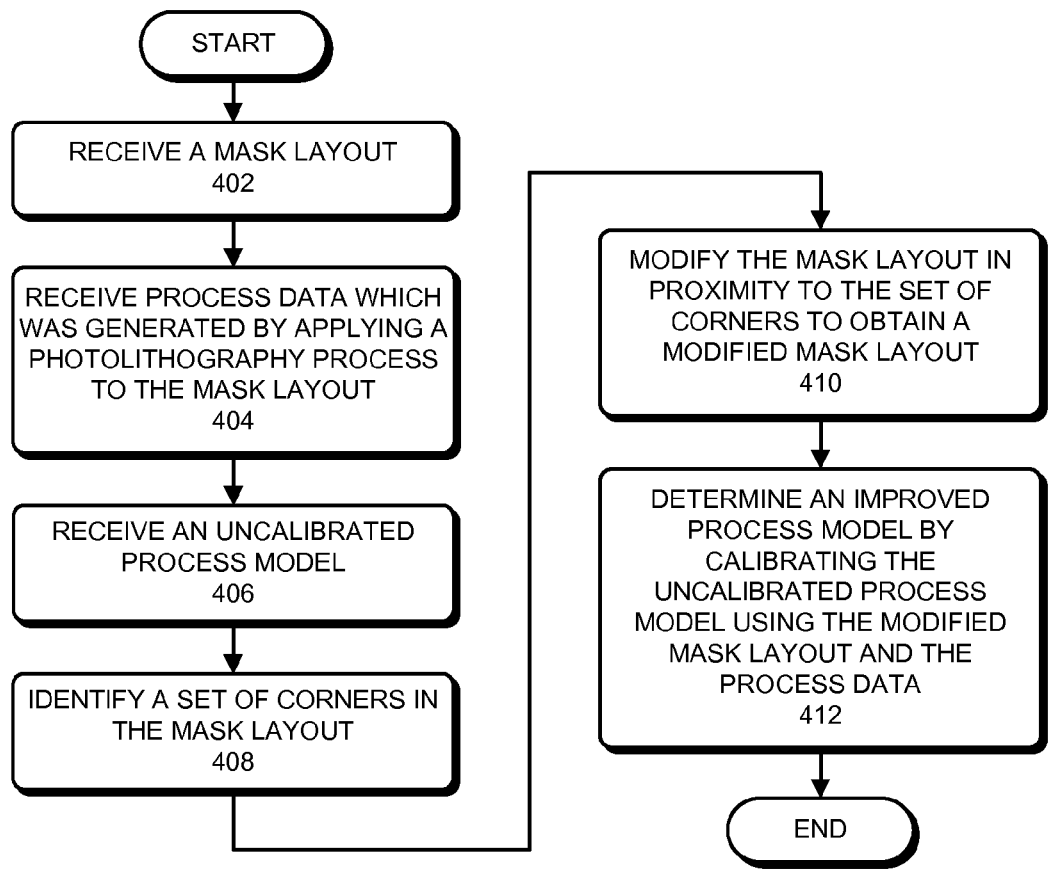
FIG. 4 presents a flowchart that illustrates a single-layer approach for determining a process model that models MCR effects in accordance with an embodiment of the present invention.

FIG. 4 presents a flowchart that illustrates a single-layer approach for determining a process model that models MCR effects in accordance with an embodiment of the present invention.

In the single-layer approach, the process can begin by receiving a mask layout (step 402). Note that a mask layout typically contains perfectly shaped polygons that do not represent the effects of MCR.

Next, the system can receive process data which was generated by applying a photolithography process to the mask layout (step 404). The process data may be generated by measuring critical dimensions of features that were produced when the mask layout was subjected to the semiconductor manufacturing processes that are being modeled.

The system can then receive an uncalibrated process model (step 406). The uncalibrated process model can typically be represented as $$\sum_i (C_i \cdot K_i),$$

where $K_i$ is a component or kernel, and $C_i$ is a coefficient which is associated with $K_i$. In an "uncalibrated" process model, the coefficients $C_i$ are usually unknown.

Next, the system can identify a set of corners in the mask layout (step 408).

Figure 5A:
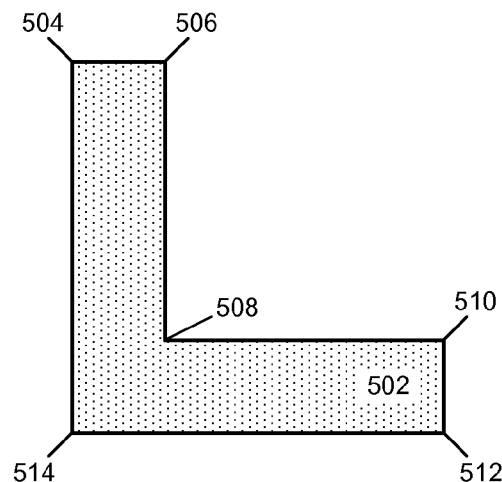
FIG. 5A illustrates a set of corners in the mask layout in accordance with an embodiment of the present invention.

FIG. 5A illustrates a set of corners in the mask layout in accordance with an embodiment of the present invention.

Polygon 502 is part of a mask layout. The system may identify all the corners in the mask layout or it may identify only some of the corners. For example, the system may identify corners 504, 506, 508, 510, 512, and 514. Further, the system may categorize the corners in a mask layout based on their shape, size, location, or any other characteristic that may affect the amount or the intensity of the MCR effect. In one embodiment, the system categorizes corners into two types: inner corners and outer corners. For example, the system may categorize corners 504, 506, 510, 512, and 514 as outer corners, and corner 508 as an inner corner.

The system can then modify the mask layout in proximity to the set of corners to obtain a modified mask layout (step 410). Although the modifications to the mask layout may relate to the MCR effects, the shapes and sizes of the modifications may not directly correspond to the actual shapes and sizes that are produced by mask corner rounding. One embodiment treats the shapes and sizes of the modifications as parameters that are fit to process data.

FIGS. 5B-5F illustrate how a mask layout can be modified in proximity to a set of corners in accordance with an embodiment of the present invention.

Figure 5B:
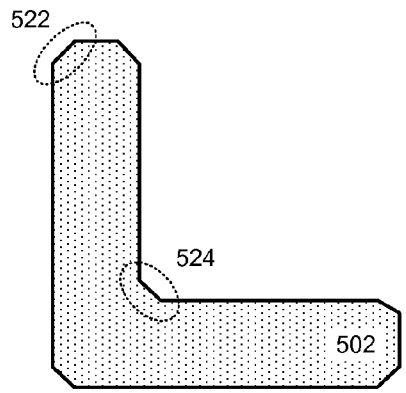
FIGS. 5B-5F illustrate how a mask layout can be modified in proximity to a set of corners in accordance with an embodiment of the present invention.

The system can modify the mask layout by adding a bevel artifact to a corner in the set of corners. FIG. 5B illustrates how the system can add bevel artifacts 522 and 524 to outer corner 504 and inner corner 508, respectively. Although FIG. 5B shows that bevel artifacts were added to all the corners of the polygon, the system may add a bevel artifact to only some of the corners of a polygon. The size of the bevel artifact may not directly correspond to the actual amount of rounding that occurs during mask fabrication. Specifically, one embodiment empirically determines the bevel size that maximally improves process model accuracy.

Note that adding a bevel artifact to an outer corner usually cuts into the polygon, e.g., bevel artifact 522, whereas adding a bevel artifact to an inner corner usually increases the area of the polygon, e.g., bevel artifact 524. One embodiment of the present invention directly models this difference between inner and outer corners because it modifies the mask layout differently in proximity to inner and outer corners. In contrast, conventional approaches that use black-box modeling may not be able to capture this difference.

Figure 5C:
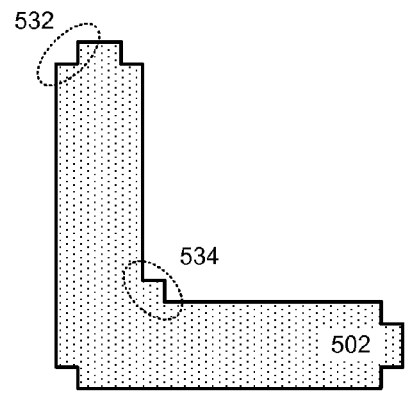

Instead of adding a bevel artifact, the system can add a notch artifact. FIG. 5C illustrates how the system can add notch artifacts 532 and 534 to outer corner 504 and inner corner 508, respectively. Just like bevel artifacts, adding a notch artifact to an outer corner usually cuts into the polygon, e.g., notch artifact 532, whereas adding a notch artifact to an inner corner usually increases the area of the polygon, e.g., notch artifact 534. Although FIG. 5C shows that notch artifacts were added to all the corners of the polygon, the system may add a notch artifact to only some of the corners of a polygon. Further, just like bevel artifacts, an embodiment may empirically determine the notch size that maximally improves process model accuracy.

Figure 5D:
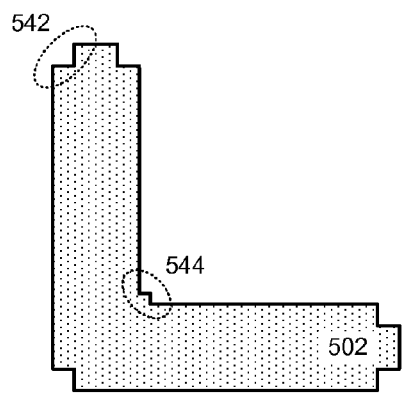
Figure 5E:
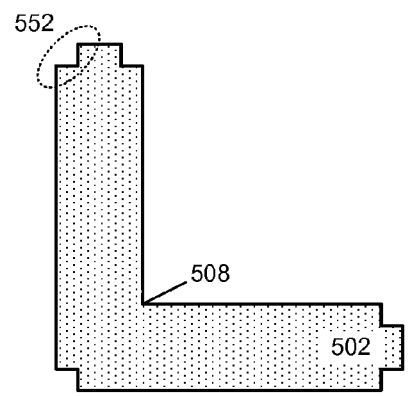

The system may add different types of artifacts to different types of corners. In particular, the system may add different types of artifacts to inner and outer corners. For example, the system can add different sized notches to inner and outer corners. FIG. 5D illustrates how the system can add a larger notch to outer corners, e.g., notch 542, and a smaller notch to inner corners, e.g., notch 544. FIG. 5E illustrates how the system can add a notch artifact to only outer corners, e.g., notch 552, and not add any notches to inner corner, e.g., corner 508.

Figure 5F:
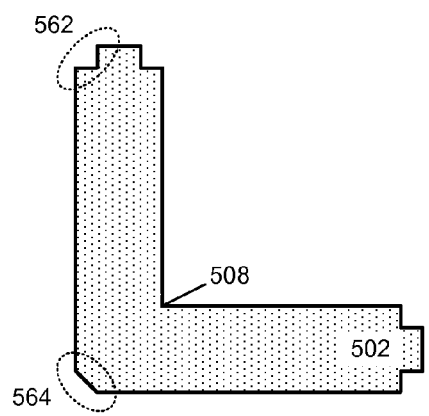

Alternatively, the system may add a notch to an inner corner and a bevel to an outer corner, or vice versa. These artifacts and modification techniques have been presented for illustration purposes and are not intended to limit the present invention. Many modifications and variations will be readily apparent to practitioners skilled in the art. For example, FIG. 5F illustrates how the system may add notches to some corners, e.g., notch 562, bevels to some corners, e.g., bevel 564, and may not add any artifacts to some corners, e.g., corner 508.

Next, the system can determine the improved process model by calibrating the uncalibrated process model using the modified mask layout and the process data (step 412).

Specifically, the system can determine the process model by fitting coefficients in the uncalibrated process model using the process data. The fitting process can include convolving the kernels in the uncalibrated process model with the modified mask layout. For example, one embodiment can use a least square fitting technique to calibrate the process model. Specifically, coefficients $C_j$ in the uncalibrated process model $$\sum_{j=1}^{m} (C_j \cdot K_j),$$

can be determined by solving for a least square fit as follows:

$$\begin{pmatrix} M_1 \otimes K_1 & \cdots & M_1 \otimes K_m \\ \vdots & \ddots & \vdots \\ M_n \otimes K_1 & \cdots & M_n \otimes K_m \end{pmatrix} \cdot \begin{pmatrix} C_1 \\ \vdots \\ C_m \end{pmatrix} \approx \begin{pmatrix} d_1 \\ \vdots \\ d_n \end{pmatrix},$$

where $M_i \otimes K_j$ is the convolution of the mask layout with kernel $K_j$ at sample point i, and $d_i$ is the empirical process data at sample point i. Note that the above equation indicates that the two sides of the equation may be approximately equal to one another. This is because it may be impossible to determine a set of coefficients that exactly satisfies the equation. However, when such a set of coefficients exist, the "approximately equal" sign in the equation should be interpreted as an equality sign.

Multi-Layer Approach

Figure 6:
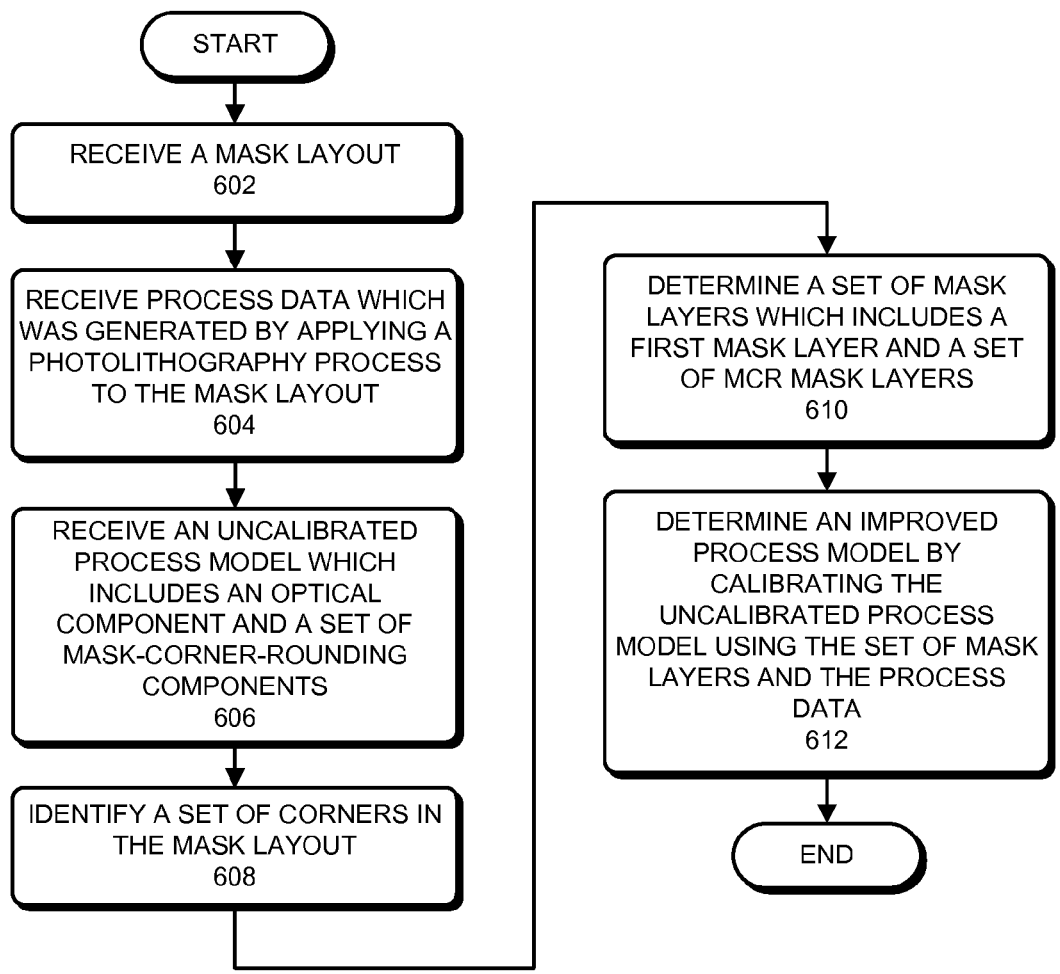
FIG. 6 presents a flowchart that illustrates a multi-layer approach for determining a process model that models MCR effects in accordance with an embodiment of the present invention.

FIG. 6 presents a flowchart that illustrates a multi-layer approach for determining a process model that models MCR effects in accordance with an embodiment of the present invention.

As in the single-layer approach, the multi-layer approach can begin by receiving a mask layout (step 602), and receive process data which was generated by applying a photolithography process to the mask layout (step 604).

Next, the system can receive an uncalibrated process model which can include an optical component and a set of mask-corner-rounding (MCR) components (step 606). The set of MCR components can include one or more MCR components that are designed to model MCR effects. Note that the phrase "a set of MCR components," as used here, does not necessarily imply that the set has a plurality of MCR components. Specifically, in one embodiment, the set may contain only one MCR component.

For example, the uncalibrated process model may be expressed as:

$$\sum_{i=1}^{m} (C_i \cdot K_i) + \sum_{j=1}^{n} X_j,$$

where $$\sum_i (C_i \cdot K_i)$$

represents an optical component with m kernels, and $X_j$ represents the $j^{th}$ MCR component. Each MCR component can comprise one or more kernels, e.g., $$X_j = \sum_{k=1}^{n} (C_k^j \cdot K_k^j),$$

where $C_k^j$ is the $k^{th}$ coefficient in the $j^{th}$ MCR component, and $K_k^j$ is the $k^{th}$ kernel in the $j^{th}$ MCR component.

In one embodiment, the set of MCR components may contain two components: an inner-corner component and an outer-corner component for modeling MCR effects of inner corners and outer corners, respectively.

Note that it may be beneficial to use a set of MCR components because these components may also help to model other effects, e.g., etch effects. Specifically, using the set of MCR components may provide an additional degree of freedom during the fitting process which can help to improve the overall accuracy of the process model.

Next, the system can identify a set of corners in the mask layout (step 608).

The system can then determine a set of mask layers which includes a first mask layer and a set of MCR mask layers (step 610). The first mask layer can include substantially all patterns in the mask layout. Further, substantially all patterns in each MCR mask layer can relate to patterns in the mask layout that are in proximity to the set of corners. Each MCR mask layer can be associated with an MCR component.

Figure 7A:
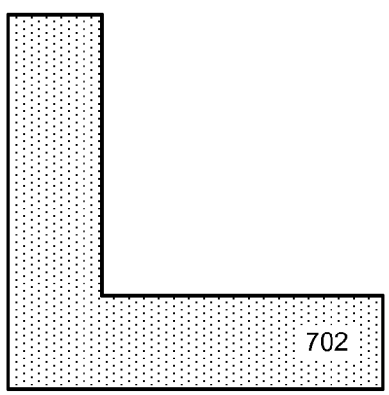
FIGS. 7A and 7B illustrate a set of mask layers in accordance with an embodiment of the present invention.
Figure 7B:
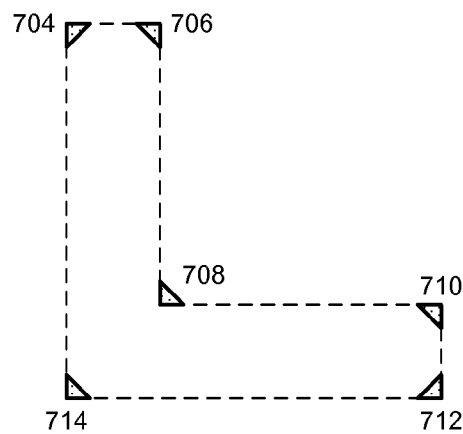

FIGS. 7A and 7B illustrate a set of mask layers in accordance with an embodiment of the present invention.

The first mask layer shown in FIG. 7A is essentially a replica of the mask layout. However, the first mask layer doesn't necessarily have to contain all patterns in the mask layout. The MCR mask layer shown in FIG. 7B contains patterns which relate to patterns in the mask layout that are in proximity to the set of corners. For example, FIG. 7B contains bevel shapes 704, 706, 708, 710, 712, and 714 that relate to the corners in polygon 702 shown in FIG. 7A.

In one embodiment, the set of MCR layers contains two mask layers: an inner-corner mask layer and an outer-corner mask layer. Substantially all patterns in the inner-corner mask layer relate to patterns in the mask layout that are in proximity to inner corners. Similarly, substantially all patterns in the outer-corner mask layer relate to patterns in the mask layout that are in proximity to outer corners.

FIG. 8A illustrates an outer corner mask layer in accordance with an embodiment of the present invention. The outer corner mask layer contains bevel shapes 804, 806, 810, 812, and 814 that relate to the outer corners in polygon 702 shown in FIG. 7A.

FIG. 8B illustrates an inner corner mask layer in accordance with an embodiment of the present invention. The inner corner mask layer contains bevel shape 808 that relates to the inner corner in polygon 702 shown in FIG. 7A.

Although the above-described mask layers use bevel shapes, the system may use other shapes, e.g., notches. These mask layer patterns have been presented for illustration purposes and are not intended to limit the present invention. Accordingly, many modifications and variations will be readily apparent to practitioners skilled in the art.

Once the mask layers have been determined, the system can determine the improved process model by calibrating the uncalibrated process model using the set of mask layers and the process data (step 612).

Specifically, the system can determine the process model by fitting coefficients in the uncalibrated process model using the process data. The fitting process can include convolving the optical component with the mask layout or with a mask layer that contains substantially all patterns in the mask layout. Further, the fitting process can also include convolving each MCR component with the associated MCR mask layer. Note that since the MCR layers usually do not contain patterns that relate to 1-D (one-dimensional) regions in the mask layout, fitting the MCR components to process data may not reduce the improved process model's accuracy for 1-D regions.

FIG. 9 presents a flowchart that illustrates a process for determining an improved process model in accordance with an embodiment of the present invention.

The system may receive a mask layout (step 902). Next, the system may identify inner corners (step 904). The system may then identify outer corners (step 906).

Next, the system may select a model form (step 908). For example, the system may select the one-layer approach or the multi-layer approach for modeling MCR effects. Note that the system may also select a hybrid approach which uses aspects of both the one-layer approach as well as the multi-layer approach. Specifically, a hybrid approach may modify the mask layout and use a set of mask layers to model mask corner rounding effects.

The system may then select a model corner form (step 910). For example, the system may select a bevel shape, a notch shape, or any other shape that is appropriate for modeling MCR effects. Next, the system may calibrate the model (step 912), and output the model (step 914).

These different options for modeling MCR effects may have different storage and computational requirements. For example, a process model that uses bevels instead of notches may be more accurate, but it may also increase the computational requirements for downstream applications. Similarly, using the multilayer approach instead of the single-layer approach may require more storage. Hence, to select an appropriate modeling approach, we may have to perform an analysis of the specific constraints and requirements of a given application.

Figure 10:
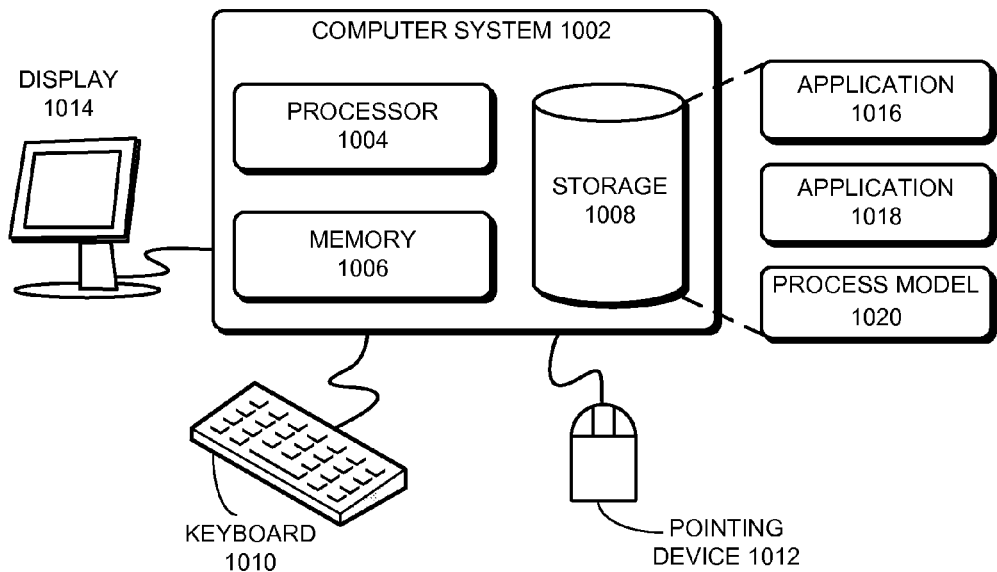
FIG. 10 illustrates a computer system in accordance with an embodiment of the present invention.

FIG. 10 illustrates a computer system in accordance with an embodiment of the present invention.

Computer system 1002 comprises processor 1004, memory 1006, and storage device 1008. Computer system 1002 can be coupled to display 1014, keyboard 1010, and pointing device 1012. Storage device 1008 can store applications 1016 and 1018, and process model 1020.

During operation, computer system 1002 can load application 1016 into memory 1006. Next, the system can use application 1016 to determine process model 1020. Application 1016 can then store process model 1020 on storage device 1008. The system can store a process model by storing the parameters and/or coefficients in a computer-readable storage medium. In one embodiment, the system may store parameters, coefficients, kernel identifiers, and information that associates the parameters and coefficients with their respective kernel identifiers. A kernel identifier can be a string that identifies a kernel, or it can be an expression that represents the kernel. The system can load application 1018 into memory 1006. Application 1018 can then load process model 1020 into memory 1006, and use process model 1020 to determine a proximity correction or to predict the shape of a pattern on a photoresist layer.

Figure 11:
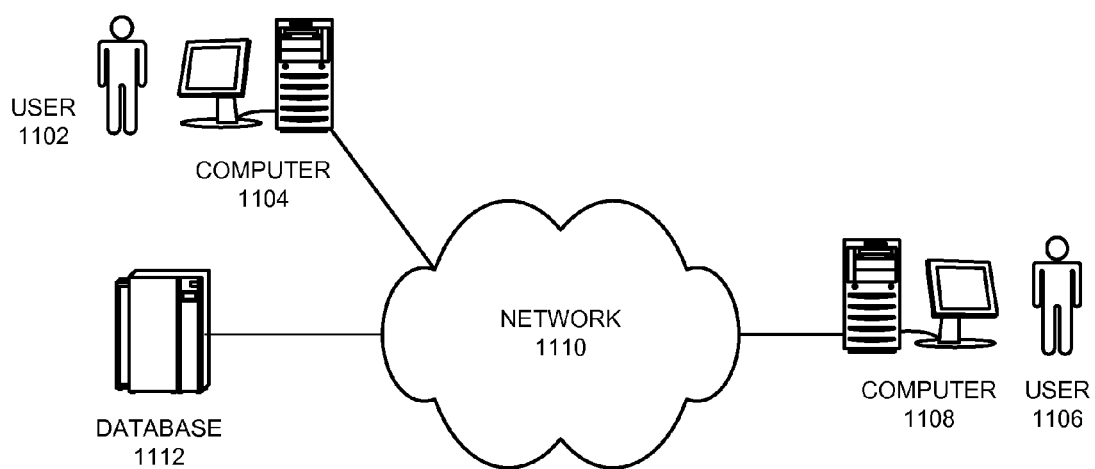
FIG. 11 illustrates how a process model can be stored in accordance with an embodiment of the present invention.

FIG. 11 illustrates how a process model can be stored in accordance with an embodiment of the present invention.

User 1102 may use computer 1104 to determine a process model. Next, user 1102 may store the parameters, coefficients, kernel identifiers, and information that associates the parameters and coefficients to the kernel identifiers on computer 1104's hard disk or a removable computer-readable storage medium. Alternatively, user 1102 may store the process model on database 1112 which is coupled to computer 1104 via network 1110. User 1106 may receive the process model from user 1102 over network 1110. Alternatively, user 1106 may retrieve the process model from database 1112. User 1106 can load the process model on computer 1108 by reading the parameters, coefficients, kernel identifiers, and the information that associates the parameters and coefficients to the kernel identifiers.

CONCLUSION

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A computer-executed method for determining a process model which models mask corner rounding effects, the method comprising:
   receiving a mask layout;
   receiving process data which was generated by applying a photolithography process to the mask layout;
   receiving an uncalibrated process model which includes:
      an optical component; and
      a set of mask-corner-rounding (MCR) components, wherein each MCR component is designed to model MCR effects;
   identifying a set of corners in the mask layout;
   determining a set of mask layers which includes:
      a first mask layer which includes substantially all patterns in the mask layout; and
      a set of MCR mask layers, wherein substantially all patterns in each MCR mask layer relate to patterns in the mask layout that are in proximity to the set of corners, and wherein each MCR mask layer is associated with an MCR component; and
   using one or more computers to calibrate the uncalibrated process model using the set of mask layers and the process data.

2. The computer-executed method of claim 1, wherein the set of MCR components includes:
   an inner-corner component for modeling MCR effects of inner corners; and
   an outer-corner component for modeling MCR effects of outer corners.

3. The computer-executed method of claim 1, wherein the set of MCR mask layers includes:
   an inner-corner mask layer, wherein substantially all shapes in the inner-corner mask layer relate to patterns in the mask layout that are in proximity to inner corners; and
   an outer-corner mask layer, wherein substantially all shapes in the outer-corner mask layer relate to patterns in the mask layout that are in proximity to outer corners.

4. The computer-executed method of claim 3, wherein the inner-corner mask layer includes bevel shapes which correspond to inner corners in the set of corners in the mask layout, and wherein the outer-corner mask layer includes bevel shapes which correspond to outer corners in the set of corners in the mask layout.

5. The computer-executed method of claim 3, wherein the inner-corner mask layer includes notch shapes which correspond to inner corners in the set of corners in the mask layout, and wherein the outer-corner mask layer includes notch shapes which correspond to outer corners in the set of corners in the mask layout.

6. The computer-executed method of claim 3, wherein the inner-corner mask layer includes shapes of a first type which correspond to inner corners in the set of corners in the mask layout, and wherein the outer-corner mask layer includes shapes of a second type which correspond to outer corners in the set of corners in the mask layout, wherein the shapes of the first type are different from the shapes of the second type.

7. The computer-executed method of claim 1, wherein calibrating the process model includes:
   convolving the optical component with the first mask layer; and
   convolving each MCR component with the associated MCR mask layer.

8. A computer-readable storage device storing instructions that when executed by a computer cause the computer to perform a method for determining a process model which models mask corner rounding effects, the method comprising:
   receiving a mask layout;
   receiving process data which was generated by applying a photolithography process to the mask layout;
   receiving an uncalibrated process model which includes:
      an optical component; and
      a set of mask-corner-rounding (MCR) components, wherein each MCR component is designed to model MCR effects;
   identifying a set of corners in the mask layout;
   determining a set of mask layers which includes:
      a first mask layer which includes substantially all patterns in the mask layout; and
      a set of MCR mask layers, wherein substantially all patterns in each MCR mask layer relate to patterns in the mask layout that are in proximity to the set of corners, and wherein each MCR mask layer is associated with an MCR component; and
   calibrating the uncalibrated process model using the set of mask layers and the process data.

9. The computer-readable storage device of claim 8, wherein the set of MCR components includes:
   an inner-corner component for modeling MCR effects of inner corners; and
   an outer-corner component for modeling MCR effects of outer corners.

10. The computer-readable storage device of claim 8, wherein the set of MCR mask layers includes:
   an inner-corner mask layer, wherein substantially all shapes in the inner-corner mask layer relate to patterns in the mask layout that are in proximity to inner corners; and
   an outer-corner mask layer, wherein substantially all shapes in the outer-corner mask layer relate to patterns in the mask layout that are in proximity to outer corners.

11. The computer-readable storage device of claim 10, wherein the inner-corner mask layer includes bevel shapes which correspond to inner corners in the set of corners in the mask layout, and wherein the outer-corner mask layer includes bevel shapes which correspond to outer corners in the set of corners in the mask layout.

12. The computer-readable storage device of claim 10, wherein the inner-corner mask layer includes notch shapes which correspond to inner corners in the set of corners in the mask layout, and wherein the outer-corner mask layer includes notch shapes which correspond to outer corners in the set of corners in the mask layout.

13. The computer-readable storage device of claim 10, wherein the inner-corner mask layer includes shapes of a first type which correspond to inner corners in the set of corners in the mask layout, and wherein the outer-corner mask layer includes shapes of a second type which correspond to outer corners in the set of corners in the mask layout, wherein the shapes of the first type are different from the shapes of the second type.

14. The computer-readable storage device of claim 8, wherein calibrating the process model includes:
   convolving the optical component with the first mask layer; and
   convolving each MCR component with the associated MCR mask layer.

15. An apparatus for determining a process model which models mask corner rounding effects, comprising:
   a processor; and
   a memory storing instructions that when executed by the processor cause the system to determine a process model which models mask corner rounding effects, the instructions comprising:
      instructions for receiving a mask layout;
      instructions for receiving process data which was generated by applying a photolithography process to the mask layout;
      instructions for receiving an uncalibrated process model which includes:
         an optical component; and
         a set of mask-corner-rounding (MCR) components, wherein each MCR component is designed to model MCR effects;
      instructions for identifying a set of corners in the mask layout;
      instructions for determining a set of mask layers which includes:
         a first mask layer which includes substantially all patterns in the mask layout; and
         a set of MCR mask layers, wherein substantially all patterns in each MCR mask layer relate to patterns in the mask layout that are in proximity to the set of corners, and wherein each MCR mask layer is associated with an MCR component; and
      instructions for calibrating the uncalibrated process model using the set of mask layers and the process data.

16. The apparatus of claim 15, wherein the set of MCR components includes:
   an inner-corner component for modeling MCR effects of inner corners; and
   an outer-corner component for modeling MCR effects of outer corners.

17. The apparatus of claim 15, wherein the set of MCR mask layers includes:
   an inner-corner mask layer, wherein substantially all shapes in the inner-corner mask layer relate to patterns in the mask layout that are in proximity to inner corners; and
   an outer-corner mask layer, wherein substantially all shapes in the outer-corner mask layer relate to patterns in the mask layout that are in proximity to outer corners.

18. The apparatus of claim 17, wherein the inner-corner mask layer includes bevel shapes which correspond to inner corners in the set of corners in the mask layout, and wherein the outer-corner mask layer includes bevel shapes which correspond to outer corners in the set of corners in the mask layout.

19. The apparatus of claim 17, wherein the inner-corner mask layer includes notch shapes which correspond to inner corners in the set of corners in the mask layout, and wherein the outer-corner mask layer includes notch shapes which correspond to outer corners in the set of corners in the mask layout.

20. The apparatus of claim 17, wherein the inner-corner mask layer includes shapes of a first type which correspond to inner corners in the set of corners in the mask layout, and wherein the outer-corner mask layer includes shapes of a second type which correspond to outer corners in the set of corners in the mask layout, wherein the shapes of the first type are different from the shapes of the second type.

21. The apparatus of claim 15, wherein the instructions for calibrating the process model includes:

instructions for convolving the optical component with the first mask layer; and instructions for convolving each MCR component with the associated MCR mask layer.

* * * * *